(12) United States Patent
Ahiko et al.

(10) Patent No.: US 7,391,219 B2
(45) Date of Patent: Jun. 24, 2008

(54) CHIP TYPE ELECTRONIC COMPONENT FOR TEST, AND MOUNTED STATE TEST METHOD

(75) Inventors: Taisuke Ahiko, Nikaho (JP); Sunao Masuda, Tokyo (JP); Masaaki Togashi, Tokyo (JP); Takashi Chiba, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/783,240

(22) Filed: Apr. 6, 2007

(65) Prior Publication Data

US 2007/0242405 A1    Oct. 18, 2007

(30) Foreign Application Priority Data

Apr. 14, 2006 (JP) .............................. 2006-112299

(51) Int. Cl.
*G01R 31/08* (2006.01)
(52) U.S. Cl. .................... 324/525; 324/555; 324/658
(58) Field of Classification Search ................ 361/529, 361/308.1, 309, 311, 303, 58; 324/500, 512, 324/519, 525, 555, 658, 691, 693, 719
See application file for complete search history.

(56) References Cited

U.S. PATENT DOCUMENTS 5,414,589 A * 5/1995 Amano et al. ............. 361/306.3
6,690,558 B1 * 2/2004 Devoe et al. ................... 361/58
2005/0067086 A1 * 3/2005 Ito et al. .................... 156/89.12

FOREIGN PATENT DOCUMENTS

| JP | A-08-222480 | 8/1996 |
|----|-------------|--------|
| JP | A 2000-208361 | 7/2000 |
| JP | A 2001-284171 | 10/2001 |
| JP | 2002-043156 | 2/2002 |
| JP | A 2005-44871 | 2/2005 |

OTHER PUBLICATIONS http://web.archive.org/web/20031218012812/http://www.bkprecision.com/www/np_specs.asp?m=881.*

* cited by examiner

*Primary Examiner*—Eric Thomas
*Assistant Examiner*—David M Sinclair
(74) *Attorney, Agent, or Firm*—Oliff & Berridge, PLC (57) ABSTRACT

A chip type electronic component for test is provided with an element body, and four or more terminal electrodes placed on the exterior of the element body. The element body has a plurality of laminated insulator layers, and a plurality of internal electrodes arranged to be opposed to each other with the insulator layer in between. Each of the internal electrodes is connected to at least one same terminal electrode out of the four or more terminal electrodes and connected to any one terminal electrode except for the at least one same terminal electrode.

3 Claims, 14 Drawing Sheets

CHIP TYPE ELECTRONIC COMPONENT FOR TEST, AND MOUNTED STATE TEST METHOD

BACKGROUND OF THE INVENTION

1. Field of the Invention

The present invention relates to a chip type electronic component for test, and a mounted state test method.

2. Related Background Art

The known multilayer electronic components include a variety of multilayer capacitors each of which comprises a capacitor element having a plurality of laminated insulator layers, and a plurality of internal electrodes arranged to be opposed to each other with the insulator layer in between, and four or more terminal electrodes placed on the exterior of the capacitor element. In the multilayer capacitor described in Japanese Patent Application Laid-Open No. 2000-208361, the opposed internal electrodes are connected each to a plurality of terminal electrodes different from those to which the other is connected. In the multilayer capacitor described in Japanese Patent Application Laid-Open No. 2001-284171, each of the opposed internal electrodes is connected to only one external electrode corresponding to the internal electrode. In the multilayer capacitor described in Japanese Patent Application Laid-Open No. 2005-044871, the opposed internal electrodes are connected each to a pair of terminal electrodes different from those to which the other is connected.

SUMMARY OF THE INVENTION

Incidentally, when a multilayer electronic component is mounted on a substrate by soldering or the like, a thermal shock is imparted to the multilayer electronic component. Normally, the element body of the multilayer electronic component is made of ceramics. With the thermal shock, therefore, the terminal electrodes are more likely to contract than the element body in the multilayer electronic component. This contraction stress is concentrated around the edges of the terminal electrodes and could initiate cracks from around the edges of the terminal electrodes into the element body or cracks in connection locations (e.g., solder fillets or the like) between the multilayer electronic component and the substrate. If the ambient temperature rapidly changes after mounting of the multilayer electronic component on the substrate, absorption of stress will be insufficient by virtue of differences among coefficients of thermal expansion of the element body, terminal electrodes, solder, and substrate and it could cause cracks in the element body or in the connection locations or the like similarly. Such cracks can result in a disconnection in the multilayer electronic component or in the connection locations. For this reason, some thermal shock resistance is required for the multilayer electronic component and for mounting of the multilayer electronic component.

A visual test or cross-section test is carried out for the connection locations and the multilayer electronic component, as a test method of testing a mounted state of the multilayer electronic component on the substrate, e.g., presence/absence of occurrence of a disconnection in the connection locations between the multilayer electronic component and the substrate and in the multilayer electronic component. The visual test is to visually check whether there appears a crack in the connection locations or in the multilayer electronic component. The cross-section test is to cut the connection location or the multilayer electronic component, polish the cross-section surface, and check whether there is a crack. However, the visual test cannot be used to check a state of a disconnection such as a crack caused inside the multilayer electronic component or inside a mounted location. On the other hand, the cross-section test limits its test locations to cut portions and cannot be used to check a state of a disconnection such as a crack in portions except for the cut portions.

A disconnection state can also be tested by measuring electric characteristics of the multilayer electronic component. In the case of the multilayer capacitor, the disconnection state can be tested by measuring the capacitance (C), dielectric loss tangent (tan δ), insulation resistance (IR), or the like. However, in a case where there is a crack but the crack part is in a partially electrically connected state, it is difficult to appropriately test the disconnection state on the basis of the electric characteristics as described above. In the case of the multilayer capacitor, the electric characteristics such as the capacitance (C), dielectric loss tangent (tan δ), and insulation resistance (IR) cannot be measured except between terminal electrodes of different polarities.

An object of the present invention is to provide a chip type electronic component for test and a mounted state test method capable of appropriately and readily testing a mounted state.

A chip type electronic component for test according to the present invention is a chip type electronic component for test comprising: an element body having a plurality of laminated insulator layers, and a plurality of internal electrodes arranged to be opposed to each other with the insulator layer in between; and four or more terminal electrodes placed on an exterior of the element body, wherein each of the plurality of internal electrodes is connected to at least one same terminal electrode out of the four or more terminal electrodes and connected to any one terminal electrode except for the at least one same terminal electrode.

A mounted state test method according to the present invention is a mounted state test method comprising: preparing the foregoing chip type electronic component for test; mounting the chip type electronic component for test on a substrate; measuring a DC resistance between two connection locations out of connection locations between each of the terminal electrodes of the chip type electronic component for test mounted on the substrate, and the substrate; and determining a disconnection state between the connection locations, based on a value of the DC resistance measured.

The chip type electronic component for test according to the present invention is in a state in which the four or more terminal electrodes all are short-circuited. When the DC resistance is measured between any two connection locations out of the connection locations between each of the terminal electrodes and the substrate in a mounted state of this chip type electronic component for test on the substrate, the DC resistance is a value reflecting the disconnection state between the connection locations. Namely, when the disconnection state is a state in which there occurs a crack or defective soldering but the pertinent part is partially electrically connected, the DC resistance becomes larger than in a state in which the pertinent part is properly electrically connected without occurrence of a crack or defective soldering. Since the chip type electronic component for test is in a state in which the four or more terminal electrodes all are short-circuited, the DC resistance can be measured between any connection locations out of all the connection locations and a position of occurrence of a disconnection can also be specified. As a result of these, the mounted state can be appropriately and readily tested in the chip type electronic component for test and in the mounted state test method according to the present invention.

Preferably, each of the plurality of internal electrodes is connected to all of the four or more terminal electrodes.

Preferably, each of the plurality of internal electrodes includes a conductor portion opposed to another with the insulator layer in between, and a conductor portion led out from the aforementioned conductor portion and connected to the terminal electrodes.

A mounted state test method according to the present invention is a test method of testing a mounted state of a multilayer electronic component on a substrate, the multilayer electronic component having a laminate body, a plurality of terminal electrodes placed on an exterior of the laminate body, and a plurality of internal conductors connected to the corresponding terminal electrodes out of the plurality of terminal electrodes and placed inside the laminate body, the test method comprising: preparing a chip type electronic component for test having a laminate body, terminal electrodes placed on an exterior of the laminate body and provided in the same number as the terminal electrodes of the multilayer electronic component and a plurality of internal conductors connected to all of the terminal electrodes and having an internal conductor pattern of a shape of projection of the plurality of internal conductors of the multilayer electronic component in a laminate direction of the laminate body; mounting the chip type electronic component for test on the substrate; measuring a DC resistance between any two connection locations out of connection locations between each of the terminal electrodes of the chip type electronic component for test mounted on the substrate, and the substrate; and determining a disconnection state between the connection locations, based on a value of the DC resistance measured.

In the mounted state test method according to the present invention, the chip type electronic component for test prepared is in a state in which the plurality of terminal electrodes all are short-circuited. When the DC resistance is measured between any two connection locations out of the connection locations between each of the terminal electrodes and the substrate in a mounted state of the chip type electronic component for test on the substrate, the DC resistance is a value reflecting the disconnection state between the connection locations. Namely, when the disconnection state is a state in which there is a crack or defective soldering but the pertinent part is partially electrically connected, the DC resistance is larger than in a state in which the pertinent part is properly electrically connected without occurrence of a crack or defective soldering. Since the chip type electronic component for test is in a state in which the plurality of terminal electrodes all are short-circuited, the DC resistance can be measured between any two connection locations out of all the connection locations, and a position of occurrence of a disconnection can also be specified. As a result of these, the mounted state can be properly and readily tested in the chip type electronic component for test and in the mounted state test method according to the present invention.

The present invention successfully provides the chip type electronic component for test, and the mounted state test method capable of appropriately and readily testing the mounted state.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the present invention will be described below in detail with reference to the accompanying drawings. In the description the same elements or elements with the same functionality will be denoted by the same reference symbols, without redundant description.

Figure 1:
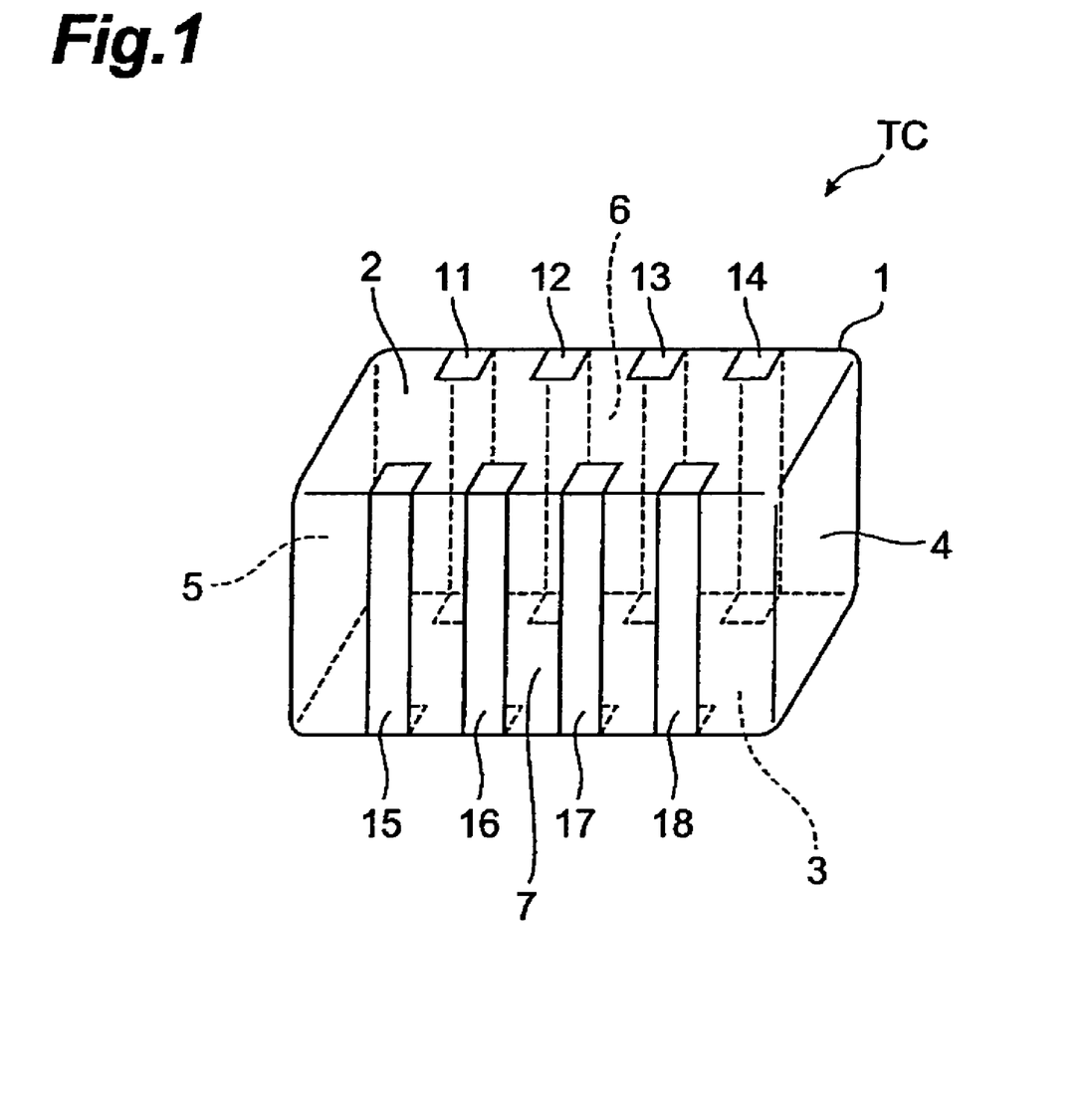
FIG. 1 is a perspective view of a chip type electronic component for test according to an embodiment of the present invention.
Figure 2:
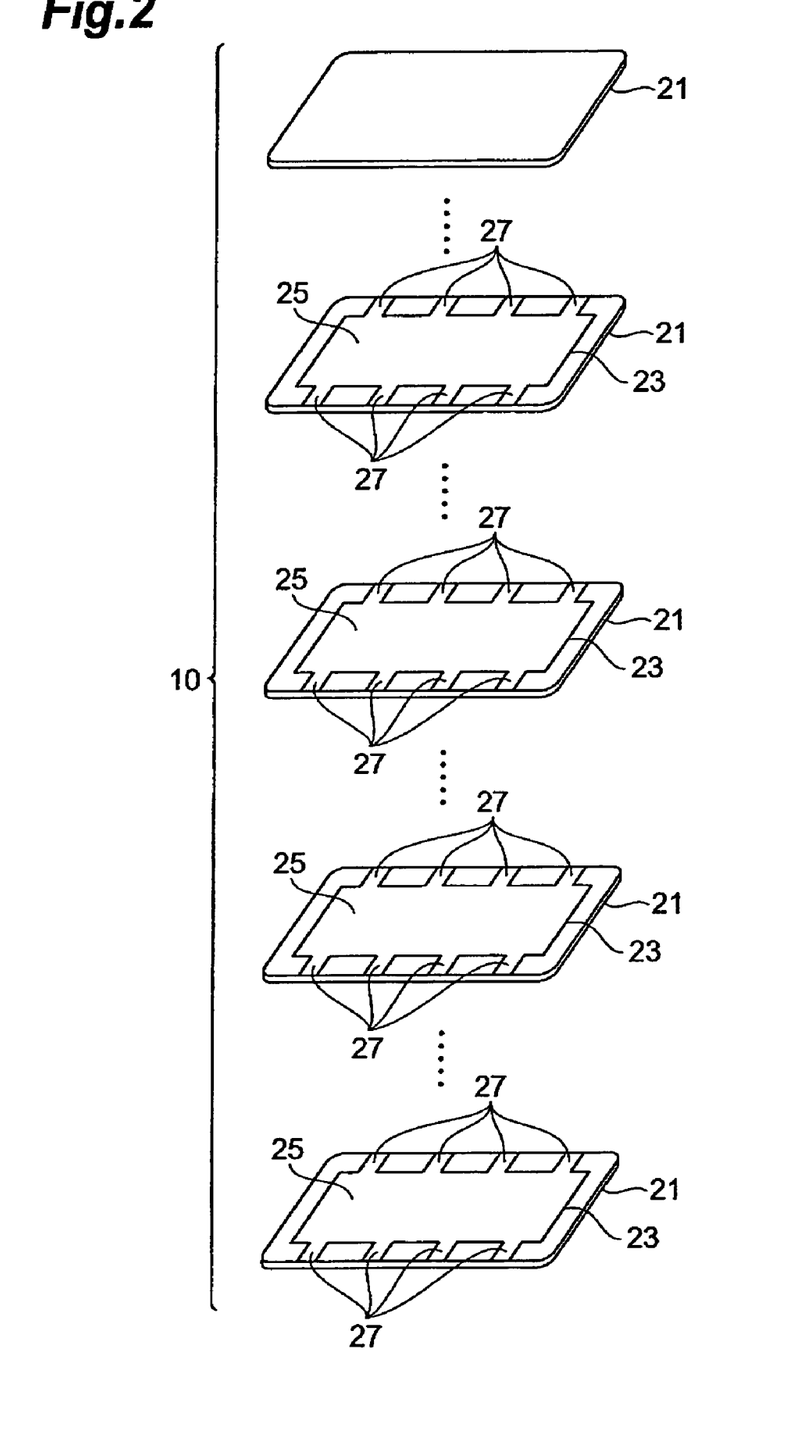
FIG. 2 is an exploded perspective view of an element body included in the chip type electronic component for test according to the embodiment.
Figure 3:
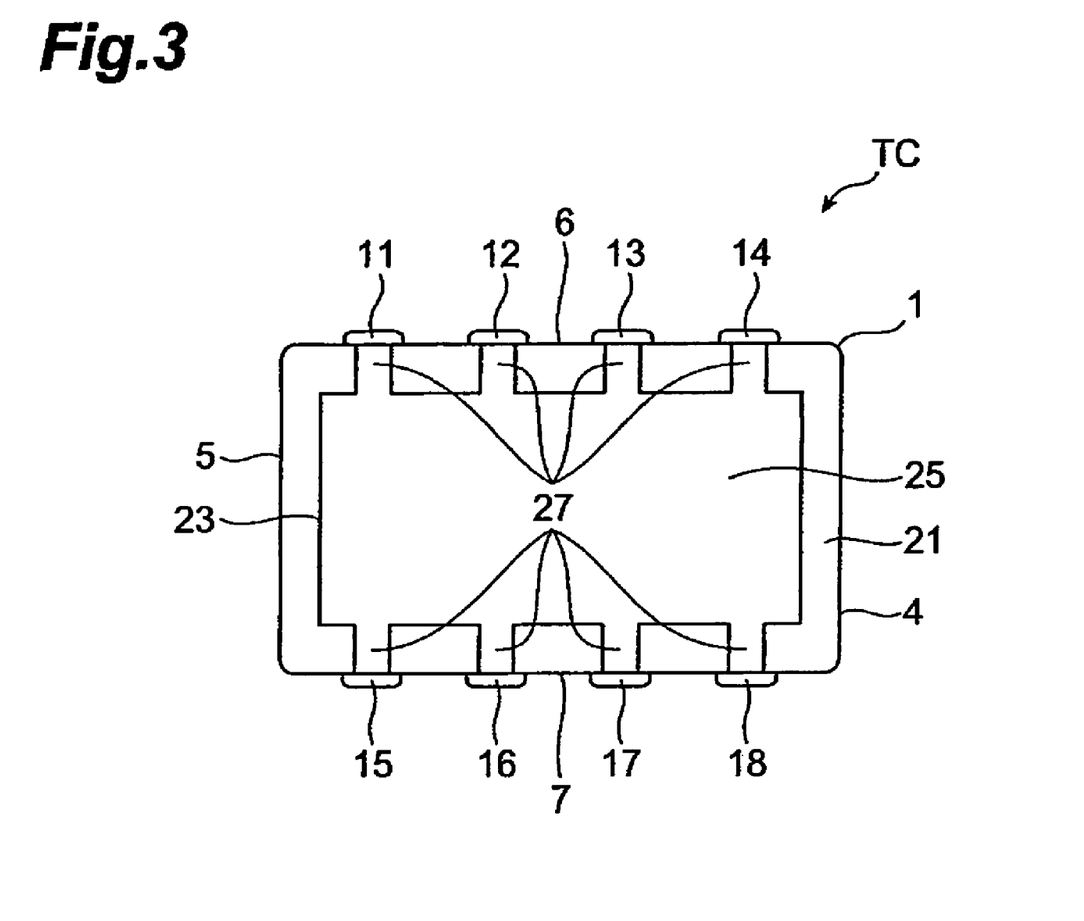
FIG. 3 is a schematic view for explaining a sectional configuration of the chip type electronic component for test according to the embodiment.

First, a configuration of a chip type electronic component for test according to an embodiment of the present invention will be described based on FIGS. 1 to 3. FIG. 1 is a perspective view of the chip type electronic component for test according to the present embodiment. FIG. 2 is an exploded perspective view of an element body included in the chip type electronic component for test according to the present embodiment. FIG. 3 is a schematic view for explaining a sectional configuration of the chip type electronic component for test according to the present embodiment.

The chip type electronic component for test TC, as shown in FIG. 1, is provided with an element body 1 of an approximately rectangular parallelepiped shape, and first to eighth terminal electrodes 11-18 placed on the exterior of the element body 1. The element body 1 includes first and second principal surfaces 2, 3 opposed to each other, first and second end faces 4, 5 opposed to each other, and first and second side faces 6, 7 opposed to each other. The first and second end faces 4, 5 and the first and second side faces 6, 7 extend so as to connect between the first principal surface 2 and the second principal surface 3.

The first to fourth terminal electrodes 11-14 are placed on the first side face 6 of the element body 1. The fifth to eighth terminal electrodes 15-18 are placed on the second side face 7 of the element body 1. The first to eighth terminal electrodes 11-18 are formed, for example, by applying an electroconductive paste containing electroconductive metal powder and glass frit, onto the exterior of the element body 1 and baking it. A plated layer may be formed on the baked electrodes according to need.

The element body 1, as shown in FIG. 2, has a plurality of laminated insulator layers 21, and a plurality of internal electrodes 23. Each insulator layer 21 extends in a direction parallel to the first and second principal surfaces 2, 3. In the element body 1, the facing direction of the first principal surface 2 and the second principal surface 3 is defined as a laminate direction of the plurality of insulator layers 21. The plurality of internal electrodes 23 are arranged to be opposed to each other with the insulator layer 21 in between.

Each insulator layer 21 is comprised, for example, of a sintered body of a ceramic green sheet containing a dielectric ceramic. In a practical chip type electronic component for test TC, the insulator layers 21 are integrally formed so that no boundary can be visually recognized between the insulator layers 21. Each internal electrode 23 is comprised of a sintered body of an electroconductive paste.

Each internal electrode 23 includes a first conductor portion 25, and a plurality of second conductor portions 27. In the present embodiment, the number of second conductor portions 27 is set to 8, corresponding to the first to eighth terminal electrodes 11-18. The first conductor portion 25 is opposed to the first conductor portion 25 of another internal electrode 23 adjacent in the laminate direction of the insulator layers 21, with the insulator layer 21 in between. Each second conductor portion 27 is led out from the first conductor portion 25 to the first side face 6 or to the second side face 7 and is electrically and physically connected to one of the first to eighth terminal electrodes 11-18.

Each internal electrode 23, as shown in FIG. 3, is electrically connected to the first to eighth terminal electrodes 11-18. This causes the first to eighth terminal electrodes 11-18 to be electrically connected to each other through the internal electrodes 23, and in the chip type electronic component for test TC all the first to eighth terminal electrodes 11-18 are in a short-circuited state.

The below will describe a mounted state determining method using the above-described chip type electronic component for test TC.

First, the chip type electronic component for test TC is prepared. This chip type electronic component for test TC is a chip type electronic component for test corresponding to a multilayer capacitor, e.g., an 8-terminal type multilayer capacitor described in Japanese Patent Application Laid-Open No. 2000-208361 or an 8-terminal type multilayer capacitor described in Japanese Patent Application Laid-Open No. 2001-284171.

In either case of the 8-terminal type multilayer capacitors described in Patent Documents 1 and 2, the chip type electronic component for test TC has the following configuration. The chip type electronic component for test TC has terminal electrodes (first to eighth terminal electrodes 11-18) in the same number as the eight terminal electrodes of the 8-terminal type multilayer capacitors described in Japanese Patent Applications Laid-Open No. 2000-208361 and Laid-Open No. 2001-284171. The internal electrodes 23 of the chip type electronic component for test TC have an internal electrode pattern of a shape of projection of the plurality of internal electrodes in the 8-terminal type multilayer capacitors described in the foregoing Laid-Open No. 2000-208361 and Laid-Open No. 2001-284171, in the laminate direction of the plurality of dielectric layers.

Figure 4:
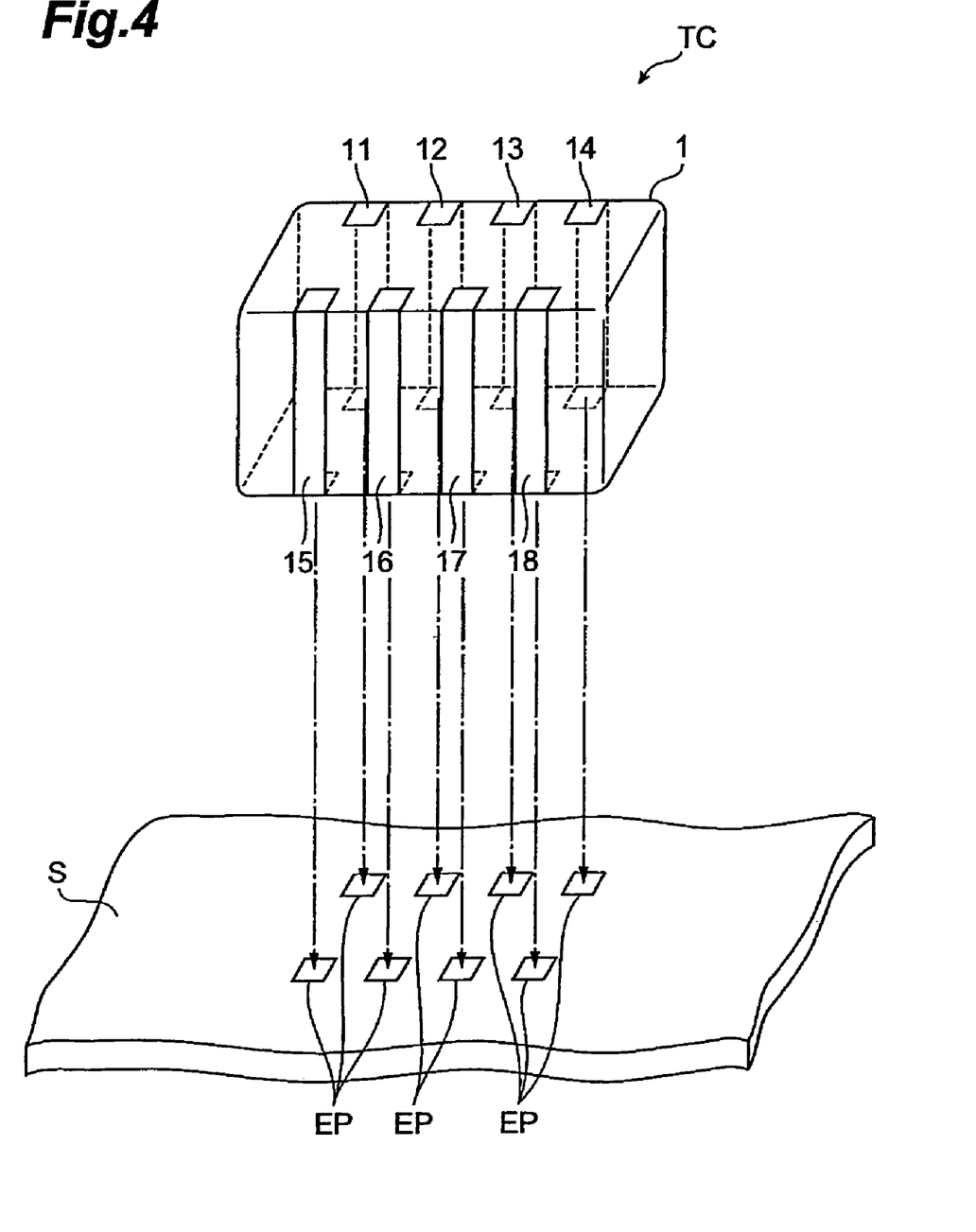
FIG. 4 is a perspective view showing a state in which the chip type electronic component for test according to the embodiment is to be mounted onto a substrate.
Figure 5:
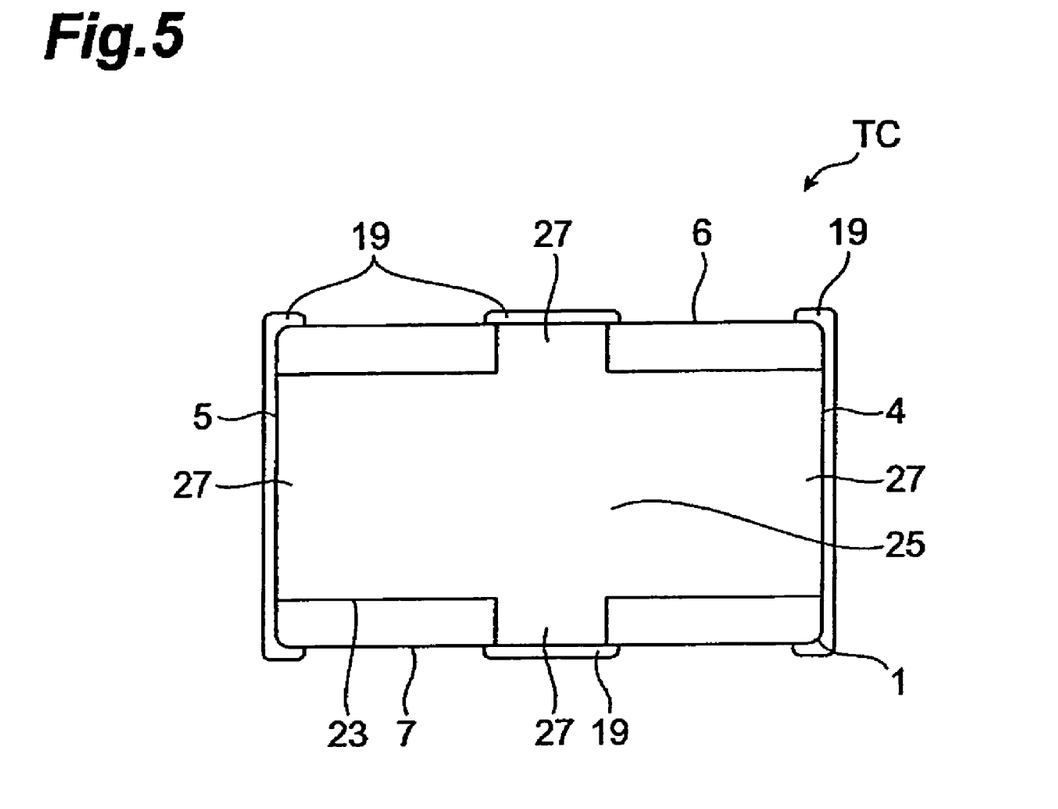
FIG. 5 is a schematic view for explaining a sectional configuration of a modification example of the chip type electronic component for test according to the embodiment.
Figure 6:
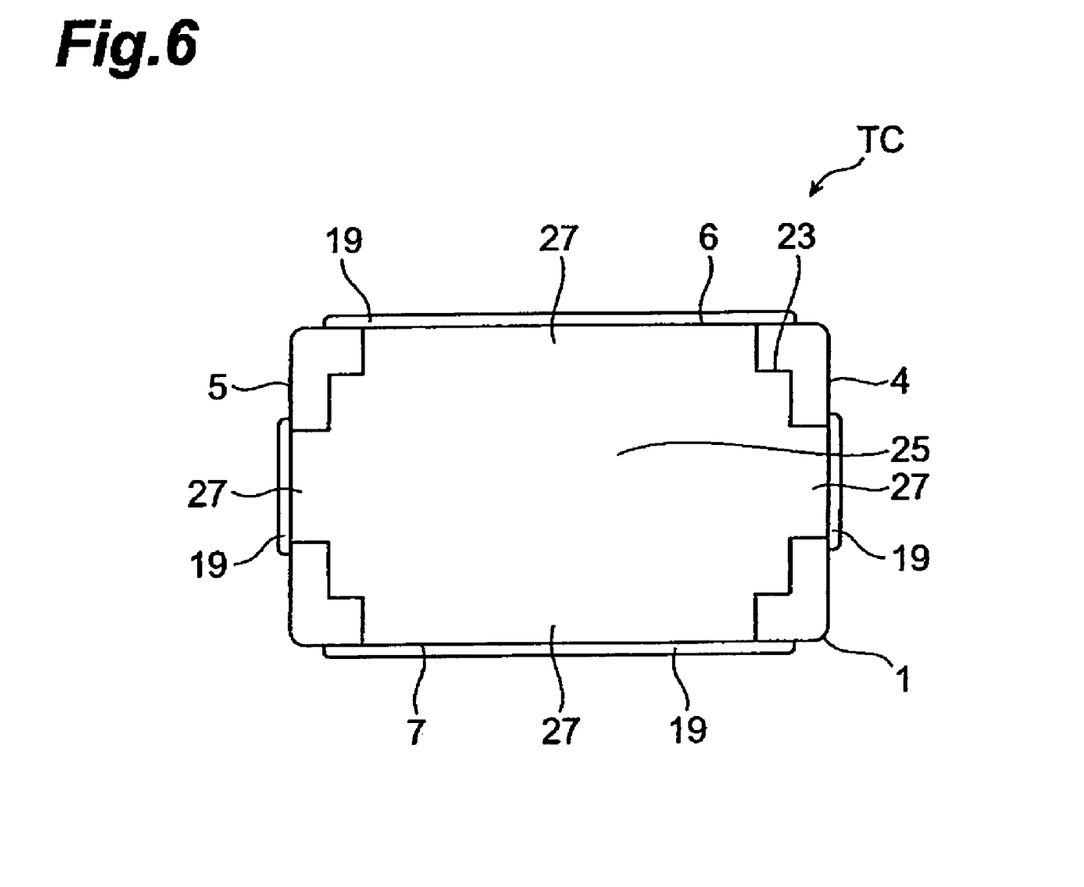
FIG. 6 is a schematic view for explaining a sectional configuration of a modification example of the chip type electronic component for test according to the embodiment.
Figure 7:
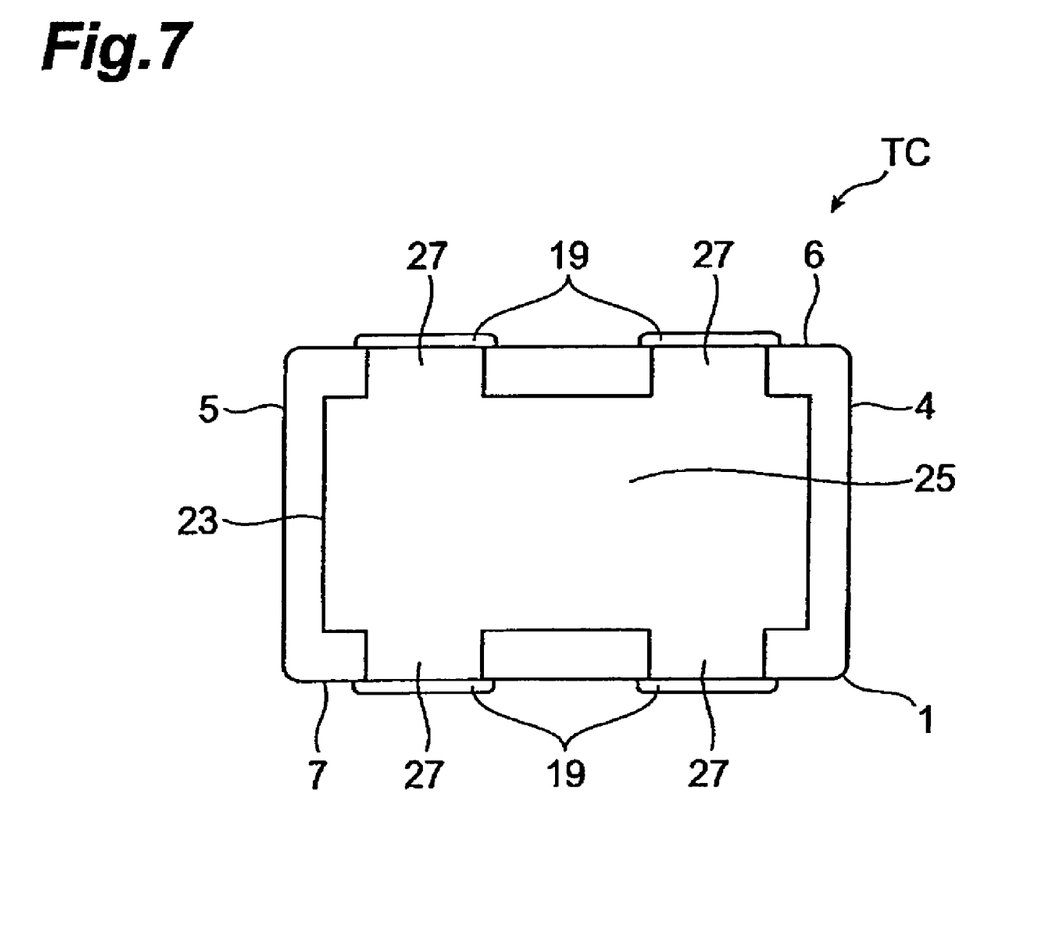
FIG. 7 is a schematic view for explaining a sectional configuration of a modification example of the chip type electronic component for test according to the embodiment.
Figure 8:
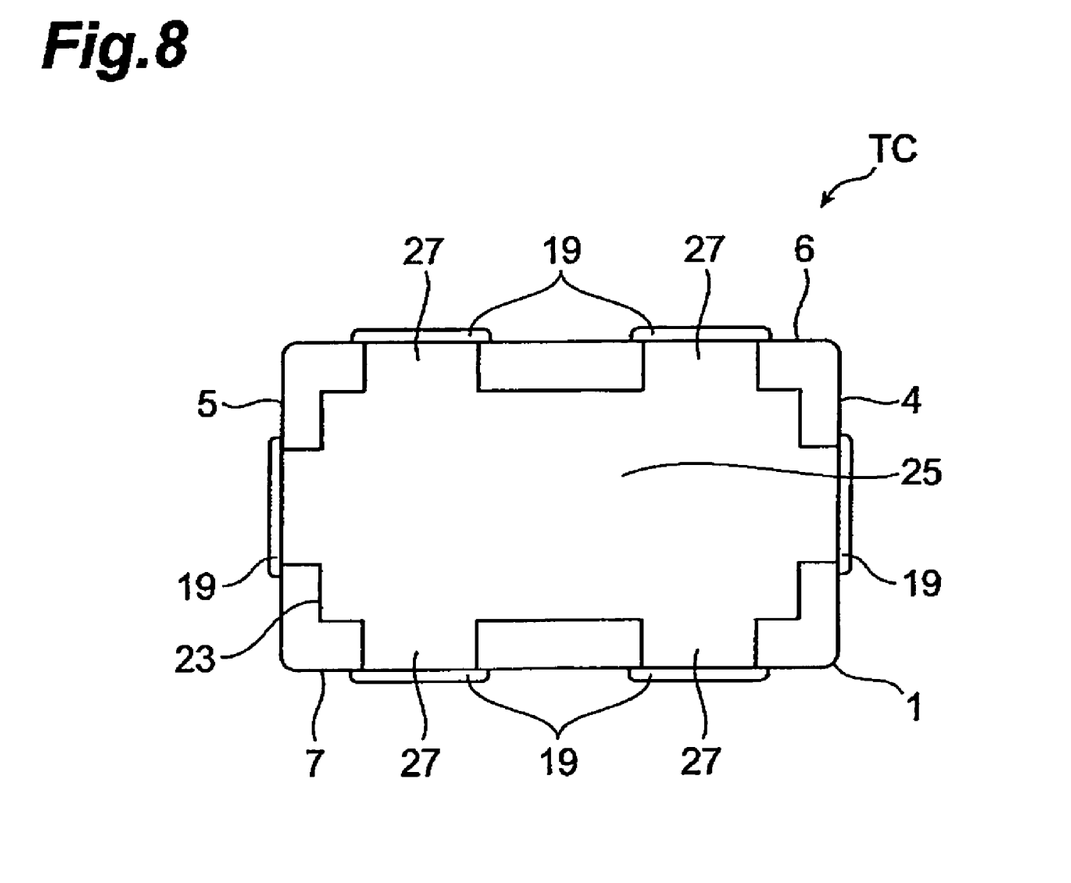
FIG. 8 is a schematic view for explaining a sectional configuration of a modification example of the chip type electronic component for test according to the embodiment.
Figure 9:
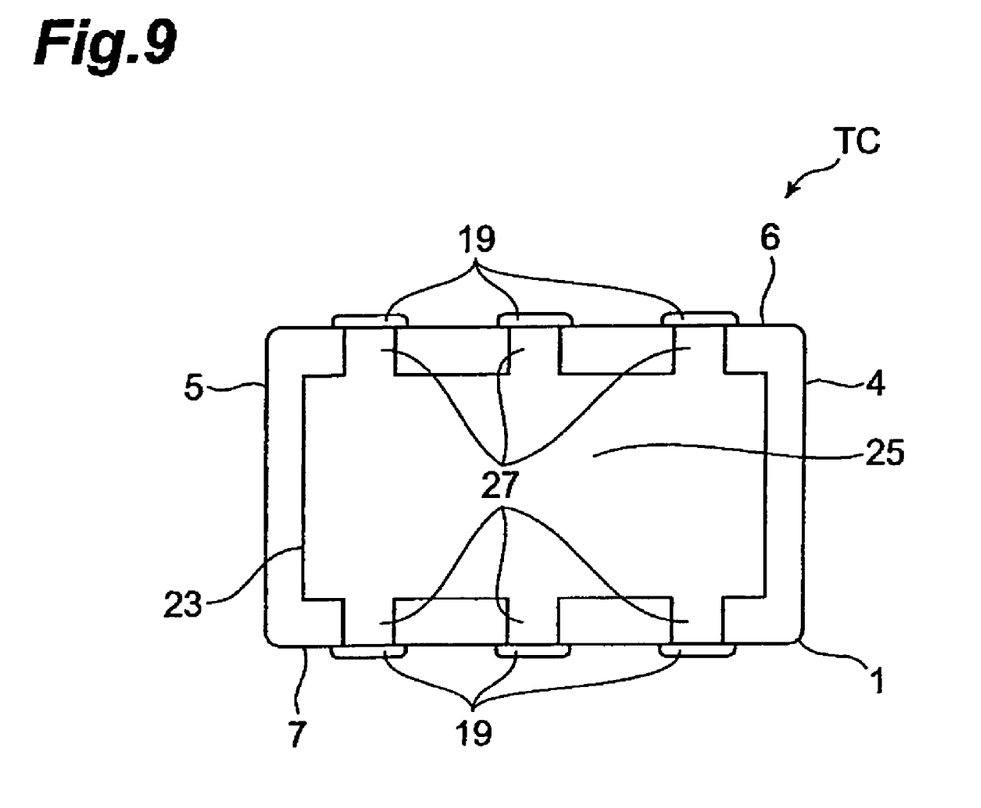
FIG. 9 is a schematic view for explaining a sectional configuration of a modification example of the chip type electronic component for test according to the embodiment.
Figure 10:
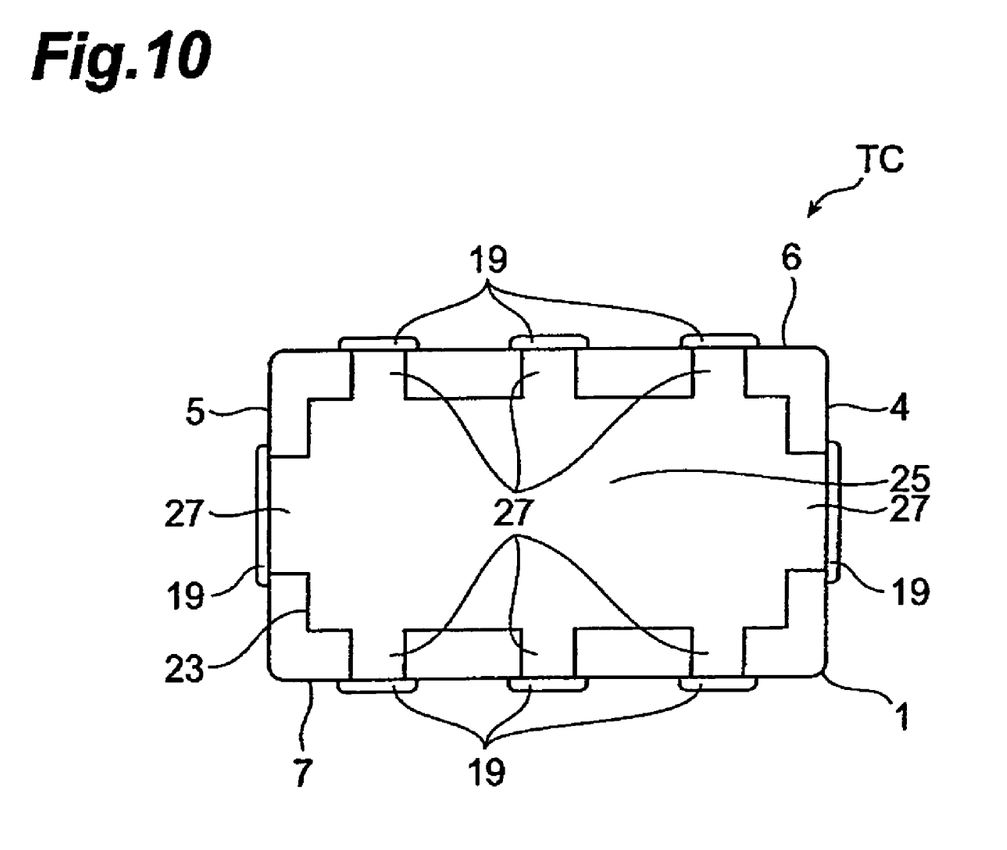
FIG. 10 is a schematic view for explaining a sectional configuration of a modification example of the chip type electronic component for test according to the embodiment.
Figure 11:
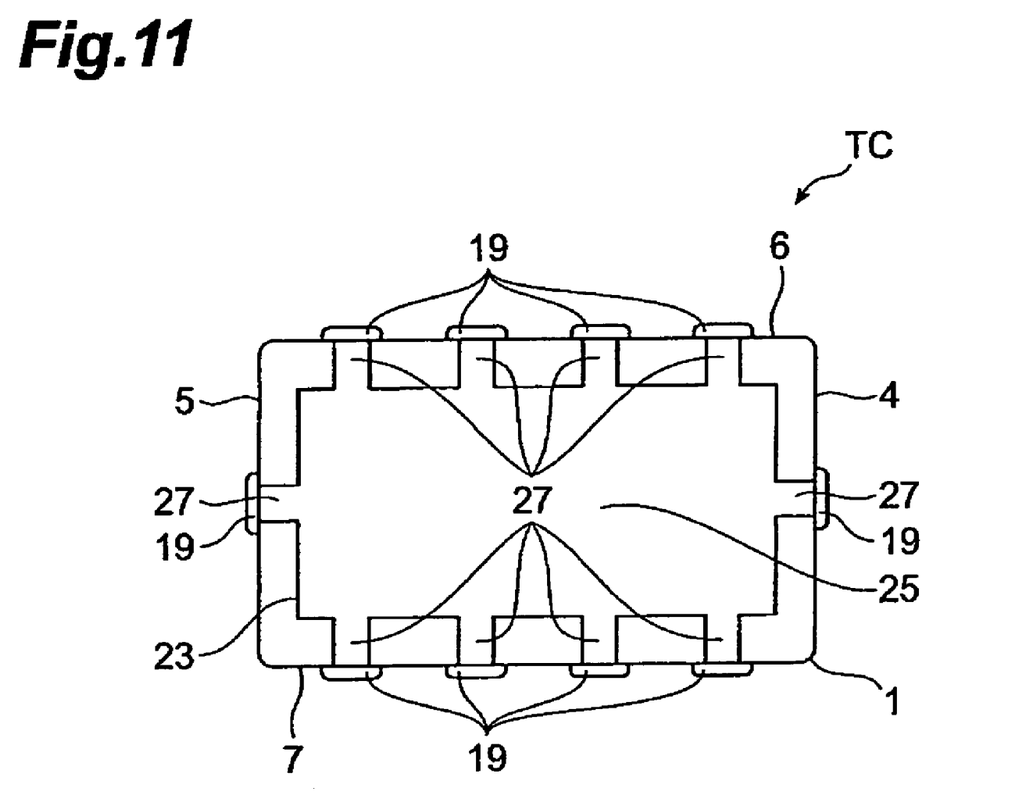
FIG. 11 is a schematic view for explaining a sectional configuration of a modification example of the chip type electronic component for test according to the embodiment.
Figure 12:
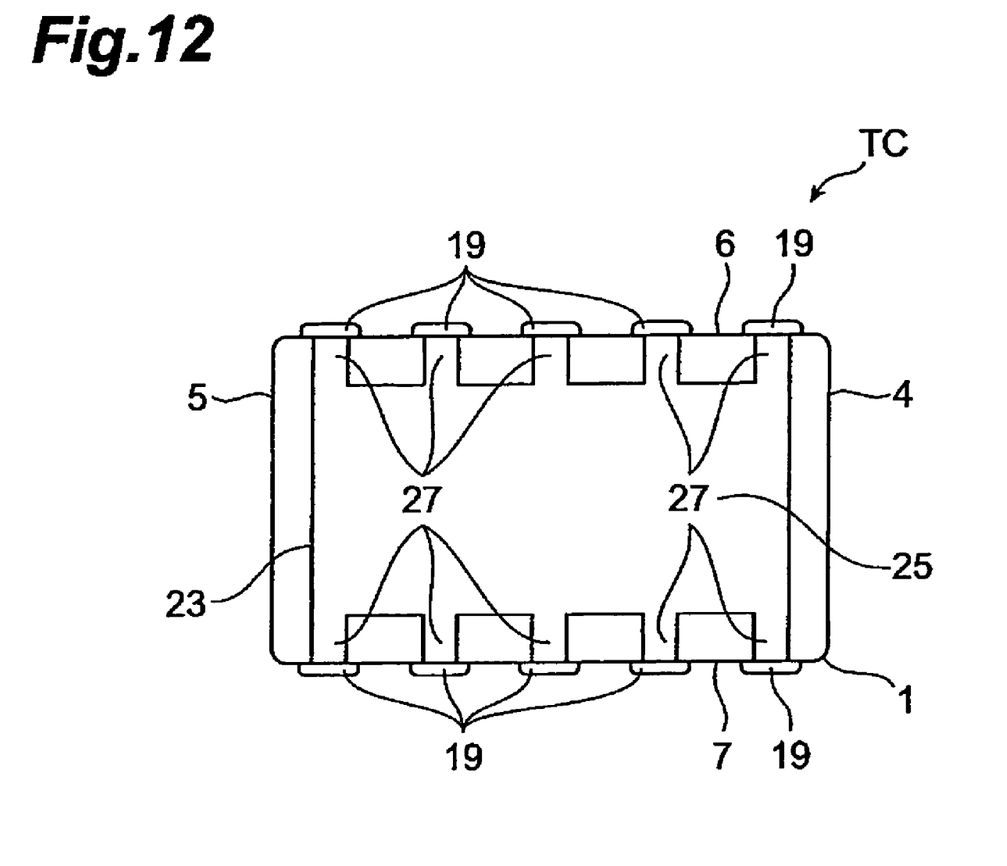
FIG. 12 is a schematic view for explaining a sectional configuration of a modification example of the chip type electronic component for test according to the embodiment.
Figure 13:
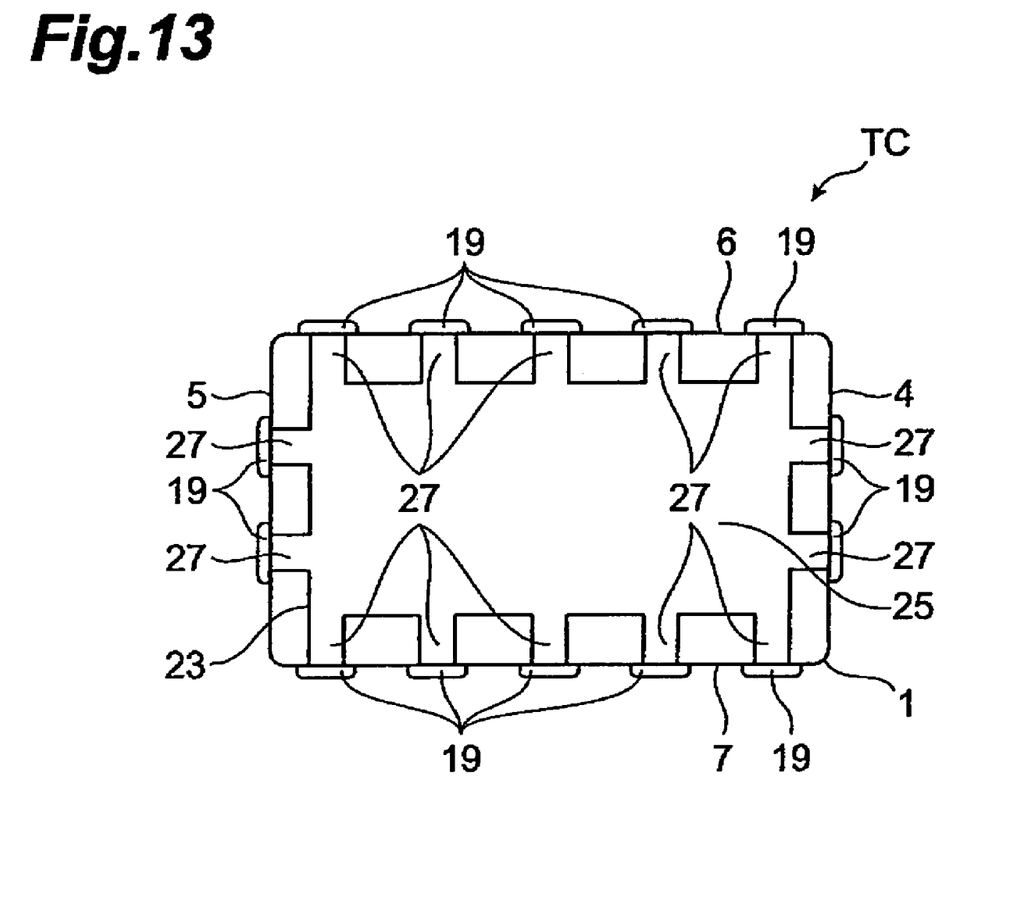
FIG. 13 is a schematic view for explaining a sectional configuration of a modification example of the chip type electronic component for test according to the embodiment.

Next, the chip type electronic component for test TC prepared is mounted, instead of the 8-terminal type multilayer capacitor, onto a substrate S (cf FIG. 4). Here the chip type electronic component for test TC is surface-mounted while the first to eighth terminal electrodes 11-18 are soldered onto corresponding electrode pads EP of the substrate S, through a solder reflow step.

Next, a thermal shock test is carried out. In this thermal shock test, the chip type electronic component for test TC mounted on the substrate S is subjected to 1000 thermal treatment cycles, each cycle consisting of step (i) to step (iv) below. Namely, one thermal treatment cycle consists of (i) a step of retaining the substrate and the chip type electronic component for test TC under a temperature condition that the temperature of the element body 1 is −55° C., for 30 minutes; (ii) a step of increasing the temperature of the element body 1 to 125° C. in a time (3 minutes) equal to 10% of the foregoing retention time; (iii) a step of retaining them under a temperature condition that the temperature of the element body 1 is 125° C., for 30 minutes; (iv) a step of decreasing the temperature of the element body 1 to −55° C. in a time (3 minutes) equal to 10% of the foregoing retention time.

Next, any two connection locations are selected out of the connection locations between the first to eighth terminal electrodes 11-18 of the chip type electronic component for test TC mounted on the substrate S, and the substrate S, and the DC resistance is measured between the two connection locations. Since in the present embodiment there are the eight connection locations, there exist twenty eight measured locations, between the connection location of the first terminal electrode 11 to the substrate S and the connection location of the second terminal electrode 12 to the substrate S, between the connection location of the first terminal electrode 11 to the substrate S and the connection location of the third terminal electrode 13 to the substrate S, . . . , between the connection location of the sixth terminal electrode 16 to the substrate S and the connection location of the eighth terminal electrode 18 to the substrate S, and between the connection location of the seventh terminal electrode 17 to the substrate S and the connection location of the eighth terminal electrode 18 to the substrate S.

Next, a disconnection state between the connection locations selected for measurement of the DC resistance is determined based on the measured value of DC resistance. For example, the following techniques can be contemplated as techniques for determining the disconnection state.

A determination technique is to compare the measured value of DC resistance with a predetermined threshold and to determine the disconnection state, based thereon. When the measured value is larger than the threshold, it is determined that an electric current path is broken because of such an event that a crack is caused somewhere on the electric current path between the measured connection locations or that defective soldering occurred during the mounting. The above threshold can be determined, for example, as follows: it is first confirmed that the chip type electronic component for test TC is properly mounted on the substrate S, the DC resistance is then measured between any two connection locations, and the measured value thus obtained is defined as the threshold.

Another determination technique is to compare measured values at respective measured locations and to determine that an electric current path is broken because of such an event that a crack is caused somewhere or defective soldering occurred during the mounting, on an electric current path between connection locations corresponding to a measured location indicating a larger measured value than those at the other measured locations.

In the present embodiment, as described above, the chip type electronic component for test TC prepared is in a state in which the first to eighth terminal electrodes 11-18 all are short-circuited. When the DC resistance is measured between any two connection locations out of the connection locations between each of the terminal electrodes 11-18 and the substrate S in the mounted state of this chip type electronic component for test TC on the substrate S, the DC resistance is a value reflecting a disconnection state between the connection locations. Namely, when the disconnection state is a state in which there is a crack or defective soldering but the pertinent part is partially electrically connected, the DC resistance becomes larger than in a state in which the pertinent part is properly electrically connected without occurrence of a crack. Since the chip type electronic component for test TC is in the state in which the first to eighth terminal electrodes 11-18 all are short-circuited, the DC resistance can be measured between any two connection locations out of all the connection locations and a position of occurrence of a disconnection can also be specified. As the result of these, the present embodiment permits us to appropriately and readily test the mounted state of the chip type electronic component for test TC, using the chip type electronic component for test TC.

In the present embodiment, the chip type electronic component for test TC is provided with the element body 1 having the configuration similar to the 8-terminal type multilayer capacitors described in Patent Documents 1 and 2. Namely, the element body 1 is constructed in the multilayer structure consisting of the insulator layers 21 of a dielectric material and the internal electrodes 23. For this reason, the thermal shock test can be carried out under the same experiment conditions as in the case where the thermal shock test is carried out for the 8-terminal type multilayer capacitors described in Patent Documents 1 and 2, and the thermal shock test can be carried out with extremely excellent repeatability.

The above described the preferred embodiment of the present invention, and it is noted that the present invention does not always have to be limited to the above-described embodiment but can be modified in many ways without departing from the scope of the invention.

The foregoing embodiment showed the configuration wherein each internal electrode 23 included the second conductor portions 27 corresponding to all the first to eighth terminal electrodes 11-18 and was connected to all the first to eighth terminal electrodes 11-18, but the present invention is not limited to this configuration. The necessary condition is that each internal electrode 23 is connected to at least one same terminal electrode out of the first to eighth terminal electrodes 11-18 and is connected to respective terminal electrodes except for the at least one same terminal electrode. When each internal electrode 23 is connected to at least one same terminal electrode out of the first to eighth terminal electrodes 11-18 in this manner, all the first to eighth terminal electrodes 11-18 become short-circuited.

The number of terminal electrodes of the chip type electronic component for test TC is not limited to 8 as in the foregoing embodiment, but may be 4 or more. For example, the chip type electronic component for test TC may have four terminal electrodes, as a chip type electronic component for test corresponding to the 3-terminal feedthrough capacitor described in Patent Document 3. In this case, each internal electrode 23 may also be connected to all the four terminal electrodes. The point is that each internal electrode 23 is connected to at least one same terminal electrode out of the four terminal electrodes and connected to any one terminal electrode except for the at least one same terminal electrode.

The terminal electrodes in the chip type electronic component for test TC do not always have to be placed only on the first and second side faces 6, 7, but may also be placed on the first and second end faces 4, 5.

Specifically, the chip type electronic component for test TC can be constructed in configurations, as shown in FIGS. 5-13, wherein the component comprises an element body 1, four or more terminal electrodes 19 placed on the exterior of the element body 1, and a plurality of internal electrodes 23 (only one internal electrode 23 of which is depicted in FIGS. 5-13).

Figure 14:
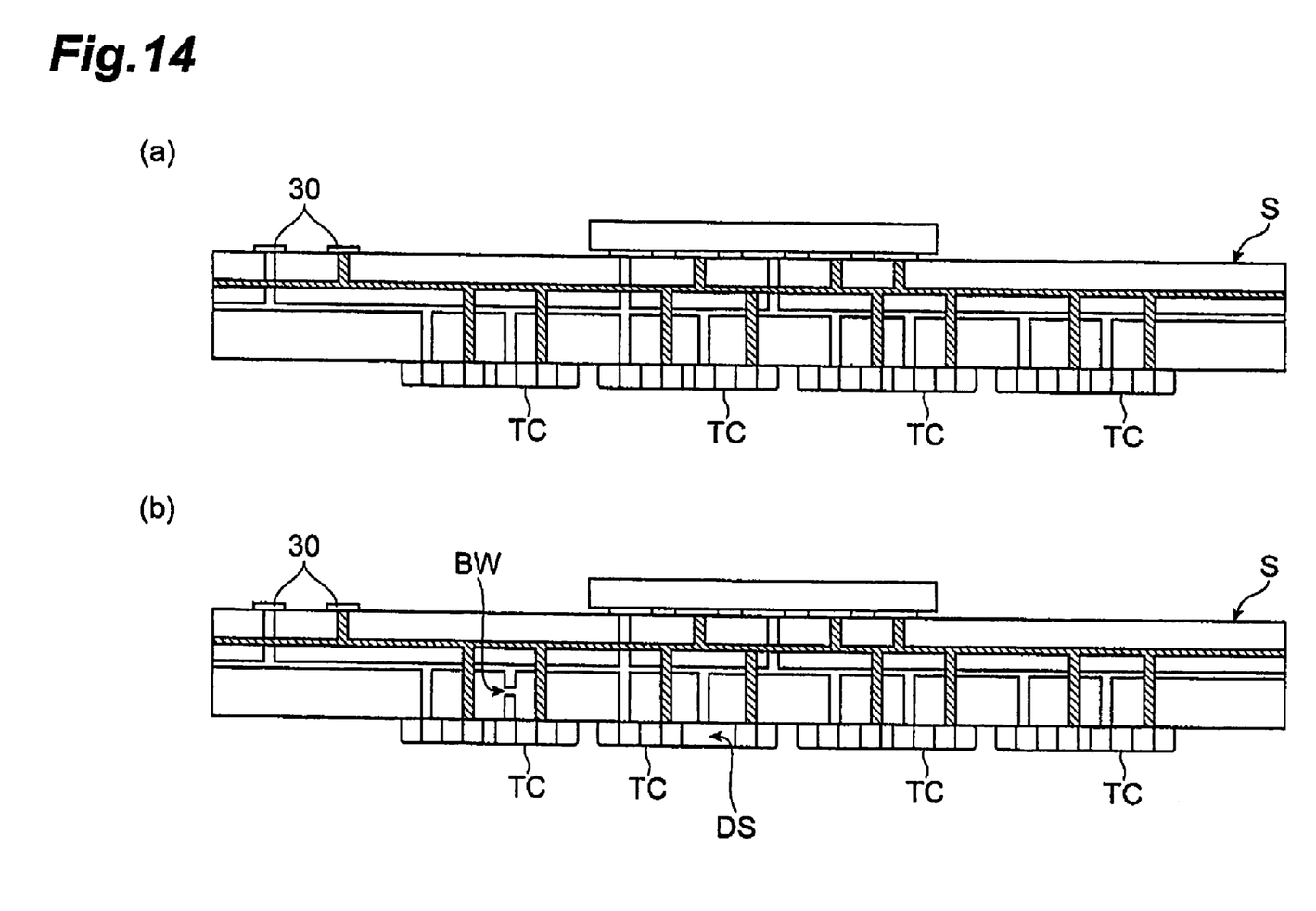
FIG. 14 is schematic views showing states in which the chip type electronic components for test according to the embodiments are mounted on a substrate.

Incidentally, since in the chip type electronic component for test TC according to the embodiment all the terminal electrodes are in the short-circuited state, it is also feasible to test a disconnection state in the substrate S on which the chip type electronic component for test TC is mounted, or a malfunction of another electronic component mounted on the substrate S. In this case, as shown in FIG. 14, a plurality of measurement electrodes 30 are provided at desired positions on a substrate S (multilayer substrate), the DC resistance is measured between any two measurement electrodes 30 out of the plurality of measurement electrodes 30, and a disconnection state can be determined based on the measured value. It is also feasible to detect a disconnection due to defective soldering of the chip type electronic component for test TC to the substrate S. In FIG. 14, (a) shows a state in which there is no disconnection in wires in the substrate S and in which the chip type electronic components for test TC are properly soldered, and (b) a state in which there is a disconnection in a wire in the substrate S (a location indicated by BW in the drawing) and in which there is defective soldering of one terminal electrode of one chip type electronic component for test TC (a location indicated by DS in the drawing). For testing the disconnection state of the substrate, it is basically preferable that all the components to be mounted on the substrate be the chip type electronic components for test TC, but chip type electronic components for test TC and multilayer capacitors may be mounted in combination, depending upon a circuit configuration of the substrate. In this case, the number of chip type electronic components for test TC to be mounted may be at least one.

The present invention is not applicable only to the chip type electronic components for test and mounted state test methods corresponding to the aforementioned multilayer capacitors, but is also applicable to chip type electronic components for test and mounted state test methods corresponding to multilayer electronic components such as multilayer chip varistors, multilayer inductors, or multilayer filters.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A chip type electronic component for test comprising:
an element body having a plurality of laminated insulator layers, and a plurality of internal electrodes arranged to be opposed to each other with an insulator layer between each pair of opposing internal electrodes; and
four or more terminal electrodes placed on an exterior of the element body;
wherein each of the plurality of internal electrodes is connected to all of the four or more terminal electrodes so that all of the four or more terminal electrodes are short-circuited through all the internal electrodes.

2. The chip type electronic component for test according to claim 1,
wherein each of the plurality of internal electrodes includes a first conductor portion opposed to another first conductor portion with the insulator layer in between, and a second conductor portion extending from the first conductor portion and connected to the terminal electrodes.

3. A mounted state test method comprising:
preparing the chip type electronic component for test as defined in claim 1;
mounting the chip type electronic component for test on a substrate;
measuring a DC resistance between two connection locations out of connection locations between each of the terminal electrodes of the chip type electronic component for test mounted on the substrate, and the substrate; and
determining a disconnection state between the connection locations, based on a value of the DC resistance measured.

* * * * *